(12) United States Patent
Barak et al.

(10) Patent No.: US 7,471,935 B2
(45) Date of Patent: Dec. 30, 2008

(54) AUTOMATIC LEVEL CONTROL

(75) Inventors: Ilan Barak, Kfar Saba (IL); Amir Francos, Tel Aviv (IL); Dimitry Petrov, Beit-Shemesh (IL)

(73) Assignee: Intel Corporation, Santa Clara, CA (US)

( * ) Notice: Subject to any disclaimer, the term of this patent is extended or adjusted under 35 U.S.C. 154(b) by 921 days.

(21) Appl. No.: 10/857,231

(22) Filed: Jun. 1, 2004

(65) Prior Publication Data

US 2004/0219944 A1    Nov. 4, 2004

Related U.S. Application Data

(62) Division of application No. 09/693,829, filed on Oct. 23, 2000, now abandoned.

(51) Int. Cl.
*H01Q 11/12* (2006.01)
*H04B 1/04* (2006.01)

(52) U.S. Cl. .............. 455/127.2; 455/127.3; 455/115.3; 455/126; 375/297

(58) Field of Classification Search .............. 455/114.3, 455/126, 127.1–127.5, 115.1–115.4; 375/297
See application file for complete search history.

(56) References Cited

U.S. PATENT DOCUMENTS

| | | | |
|---|---|---|---|
| 5,113,525 A * | 5/1992 | Andoh ..................... 455/127.2 |
| 5,170,495 A | 12/1992 | McNicol et al. |
| 5,193,224 A | 3/1993 | McNicol et al. |
| 5,214,393 A * | 5/1993 | Aihara ........................ 330/279 |
| 5,241,694 A * | 8/1993 | Vais/anen et al. ............ 455/126 |
| 5,313,658 A * | 5/1994 | Nakamura .................... 455/69 |
| 5,457,811 A | 10/1995 | Lemson |
| 5,507,017 A | 4/1996 | Whitmarsh et al. |
| 5,515,008 A * | 5/1996 | Ueda et al. ................... 330/280 |
| 5,566,363 A * | 10/1996 | Senda ........................ 455/126 |
| 5,625,647 A * | 4/1997 | Kawasaki .................... 375/295 |
| 5,752,171 A * | 5/1998 | Akiya ........................ 455/126 |
| 5,768,694 A * | 6/1998 | Kumagai .................... 455/126 |
| 5,852,770 A * | 12/1998 | Kasamatsu .................. 455/126 |

(Continued)

OTHER PUBLICATIONS

Lohtia, A., Goud, P., Englefield, C., "An Adaptive Digital Technique for Compensating for Analog Quadrature Modulator/Demodulator Impairments", IEEE, Communications, Computers and Signal Processing, 1993., IEEE Pacific Rim Conference on, vol. 2, May 19, 1993.*

(Continued)

*Primary Examiner*—Edward Urban
*Assistant Examiner*—RuiMeng Hu
(74) *Attorney, Agent, or Firm*—Pearl Cohen Zedek Latzer, LLP

(57) ABSTRACT

A source binary code that complies with a source architecture is translated to a target binary code that complies with a target architecture. The target binary code includes a first target portion translated from a respective source portion of the source binary code. During execution of the target binary code on a processor that complies with a target architecture, it is determined whether to retranslate the source portion to produce a second target portion that is more optimized to the target architecture than the first target portion or to retranslate the source portion to produce a third target portion that is more optimized to the target architecture than the second target portion.

10 Claims, 4 Drawing Sheets

U.S. PATENT DOCUMENTS

| | | | |
|---|---|---|---|
| 6,018,650 | A | 1/2000 | Petsko et al. |
| 6,038,428 | A * | 3/2000 | Mizusawa et al. ............ 455/69 |
| 6,108,527 | A * | 8/2000 | Urban et al. ............ 455/115.3 |
| 6,246,286 | B1 | 6/2001 | Persson |
| 6,275,684 | B1 * | 8/2001 | Kaneko et al. ............ 455/118 |
| 6,337,974 | B1 * | 1/2002 | Inamori et al. ............ 455/126 |
| 6,498,925 | B1 * | 12/2002 | Tauchi ............ 455/115.1 |
| 6,580,901 | B1 * | 6/2003 | Mochizuki ............ 455/127.1 |
| 6,711,388 | B1 * | 3/2004 | Neitiniemi ............ 455/127.1 |
| 6,868,279 | B2 * | 3/2005 | Sahlman et al. ............ 455/522 |
| 7,245,170 | B2 * | 7/2007 | Inamori et al. ............ 327/308 |
| 2001/0014587 | A1 * | 8/2001 | Ichihara ............ 455/69 |
| 2001/0023177 | A1 * | 9/2001 | Tanaka ............ 455/73 |

OTHER PUBLICATIONS

Cavers, J.K., "the Effect of Quadrature Modulator and Demodulator Errors on Adaptive Digital Predistorters for Amplifier Linearization", IEEE Trans. On Vehicular Technology, vol. 46, No. 2, May 1997.

Sundstrom, L., Faulkner, M., Johansson, M., "Effects of REconstruction Filters in digital Predistortion Linearizers for RF Power Amplifiers", IEEE Trans. On Vehicular Technology, vol. 44, No. 1, Feb. 1995.

Wright, A.S., and Durtler, W.G., "Experimental Performance of an Adaptive Digital Linearized Power Amplifier", IEEE Trans. On Vehicular Technology, vol. 41, Nov. 1992.

Carvers, J.K., "New Methods for Adaption of Quadrature Modulators and Demodulators Amplifier Linearization Circuits", IEEE Trans. On Vehicular Technology, vol. 46, No. 3, Aug. 1997.

Sundstrom, L., Faulkner, M., and Johansson, M., "Quantization Analysis and Design of a Digital Predistortion Lineartzer for RF Power Amplifiers", IEEE Trans. On Vehicular Technology, vol. 45, No. 4, Nov. 1996.

* cited by examiner

AUTOMATIC LEVEL CONTROL

CROSS-REFERENCE TO RELATED APPLICATIONS

This application is a divisional application of U.S. patent application Ser. No. 09/693,829, filed Oct. 23, 2000 now abandoned.

FIELD OF THE INVENTION

The present invention relates to automatic level control in general and to automatic level control in mobile communication systems in particular.

BACKGROUND OF THE INVENTION

With the increased penetration and use of cellular communication devices and due to various regulations, these devices are designed to transmit information at or below a predetermined power level. Due to several factors including frequency changes, temperature swings, component selection and tolerances, the actual output power can vary substantially. Consequently, the mobile phone should have a mechanism for controlling the transmitted output power and to verify that it will not be higher than the maximal output power level as allowed by the specific transmission standard. This method for regulating the transmitted output power may be viewed as a transmit automatic gain control (TX-AGC). In addition to transmitting the information at the maximum allowable power level, battery life conservation and current consumption are typically parameters in the design of the automatic gain control.

BRIEF DESCRIPTION OF THE DRAWINGS

The present invention will be understood and appreciated more fully from the following detailed description taken in conjunction with the appended drawings in which.

Figure 1:
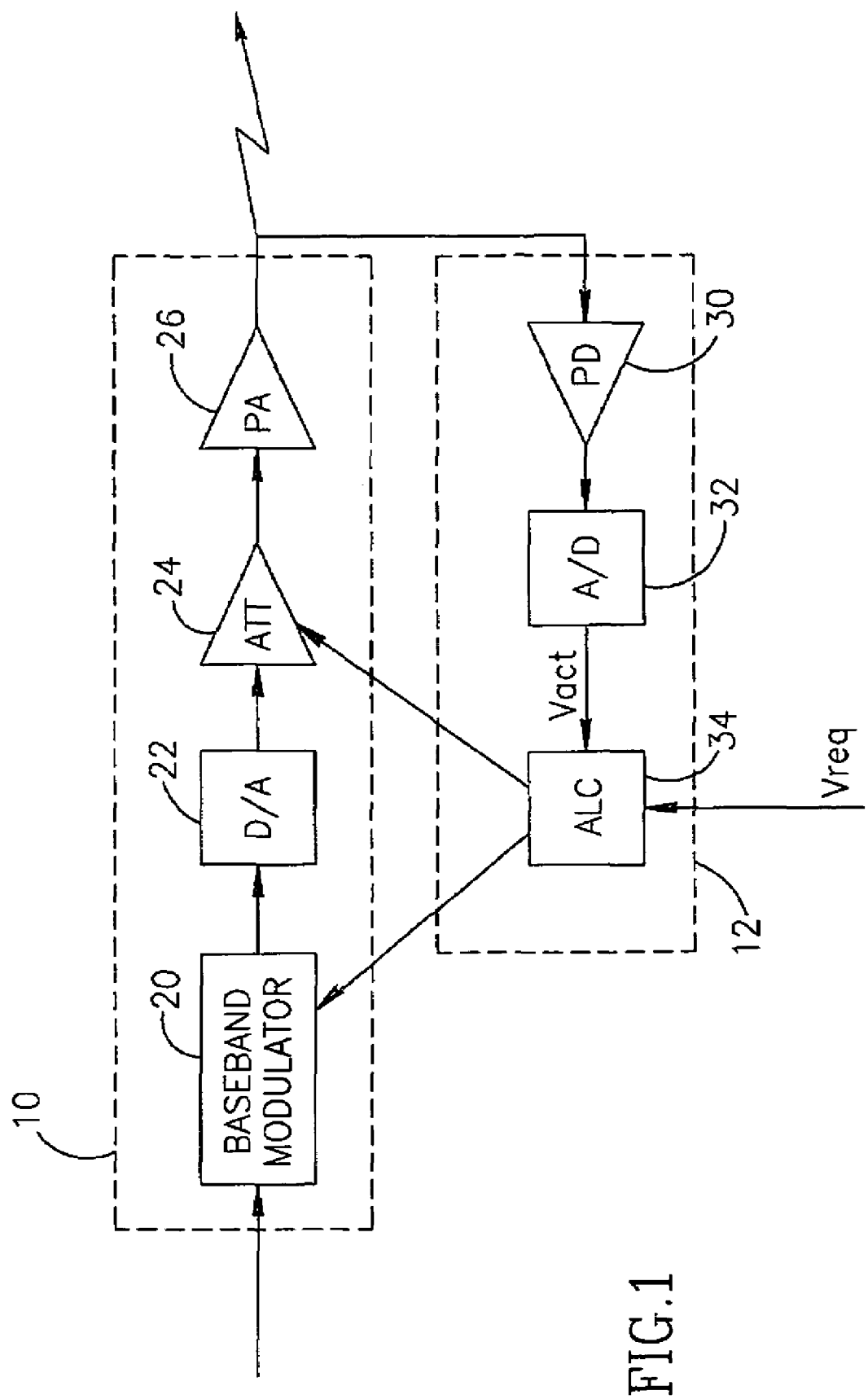
FIG. 1 is a block diagram illustration of transmission and feedback paths of a transmitter, in accordance with an embodiment of the present invention.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF EMBODIMENTS OF THE INVENTION

In the following detailed description, numerous specific details are set forth in order to provide a thorough understanding of the invention. However, it will be understood by those skilled in the art that the present invention may be practiced without these specific details. In other instances, well-known methods, procedures, components and circuits have not been described in detail so as not to obscure the present invention.

Some portions of the detailed description which follow are presented in terms of algorithms and symbolic representations of operations on data bits or binary digital signals within a computer memory. These algorithmic descriptions and representations may be the techniques used by those skilled in the data processing arts to convey the substance of their work to others skilled in the art.

An algorithm is here, and generally, considered to be a self-consistent sequence of acts or operations leading to a desired result. These include physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers or the like. It should be understood, however, that all of these and similar terms are to be associated with the appropriate physical quantities and are merely convenient labels applied to these quantities.

Unless specifically stated otherwise, as apparent from the following discussions, it is appreciated that throughout the specification discussions utilizing terms such as "processing," "computing," "calculating," "determining," or the like, refer to the action and/or processes of a computer or computing system, or similar electronic computing device, that manipulate and/or transform data represented as physical, such as electronic, quantities within the computing system's registers and/or memories into other data similarly represented as physical quantities within the computing system's memories, registers or other such information storage, transmission or display devices.

Embodiments of the present invention may include apparatuses for performing the operations herein. This apparatus may be specially constructed for the desired purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, magnetic-optical disks, read-only memories (ROMs), random access memories (RAMs), electrically programmable read-only memories (EPROMs), electrically erasable and programmable read only memories (EEPROMs), magnetic or optical cards, or any other type of media suitable for storing electronic instructions, and capable of being coupled to a computer system bus.

Reference is now made to FIG. 1, which generally illustrates elements of a transmitter. The transmitter can form part of a mobile unit or a base station that communicates with mobile units.

While FIG. 1 presents certain elements, it will be appreciated that other transmitters may or may not include all of the elements shown in FIG. 1. FIG. 1 shows a transmission path 10 and a power feedback path 12. The transmission path 10 generally comprises some or all of the following elements: a baseband modulator 20, a digital to analog (D/A) converter 22, an attenuator 24 and a power amplifier 26. Baseband modulator 20 may convert an incoming bit stream into a baseband signal having I and Q components. D/A converter 22 may convert the shaped digital signal into an analog signal. Attenuator 24 may change the power level of the analog signal, typically in incremental steps of a few decibels (dB), and power amplifier 26 may transmit the RF signal.

Power feedback path 12 comprises some or all of the following elements: a power detector (PD) 30, an analog to digital (A/D) converter 32 and an automatic level control (ALC) unit 34. Power detector 30, typically a diode, may detect the power level of the signal transmitted by power amplifier 26, and may produce a voltage level corresponding to the detected power. Analog to digital converter 32 may convert this power level signal into a digital voltage signal $V_{act}$. ALC 34 is typically operative for linear power amplifiers or for power amplifiers that are operated in their linear region.

ALC 34 may have fine and coarse control of a gain K of transmission path 10, thereby to maintain a desired power level, defined by its voltage level $V_{req}$. For example, ALC 34 may change the baseband gain of baseband modulator 20 (fine control) or the attenuation level of attenuator 24 (coarse control). Other elements in transmission path 10 that affect gain K of transmission path 10 may also be controlled by ALC 34 and such is incorporated in the present invention.

Figure 2:
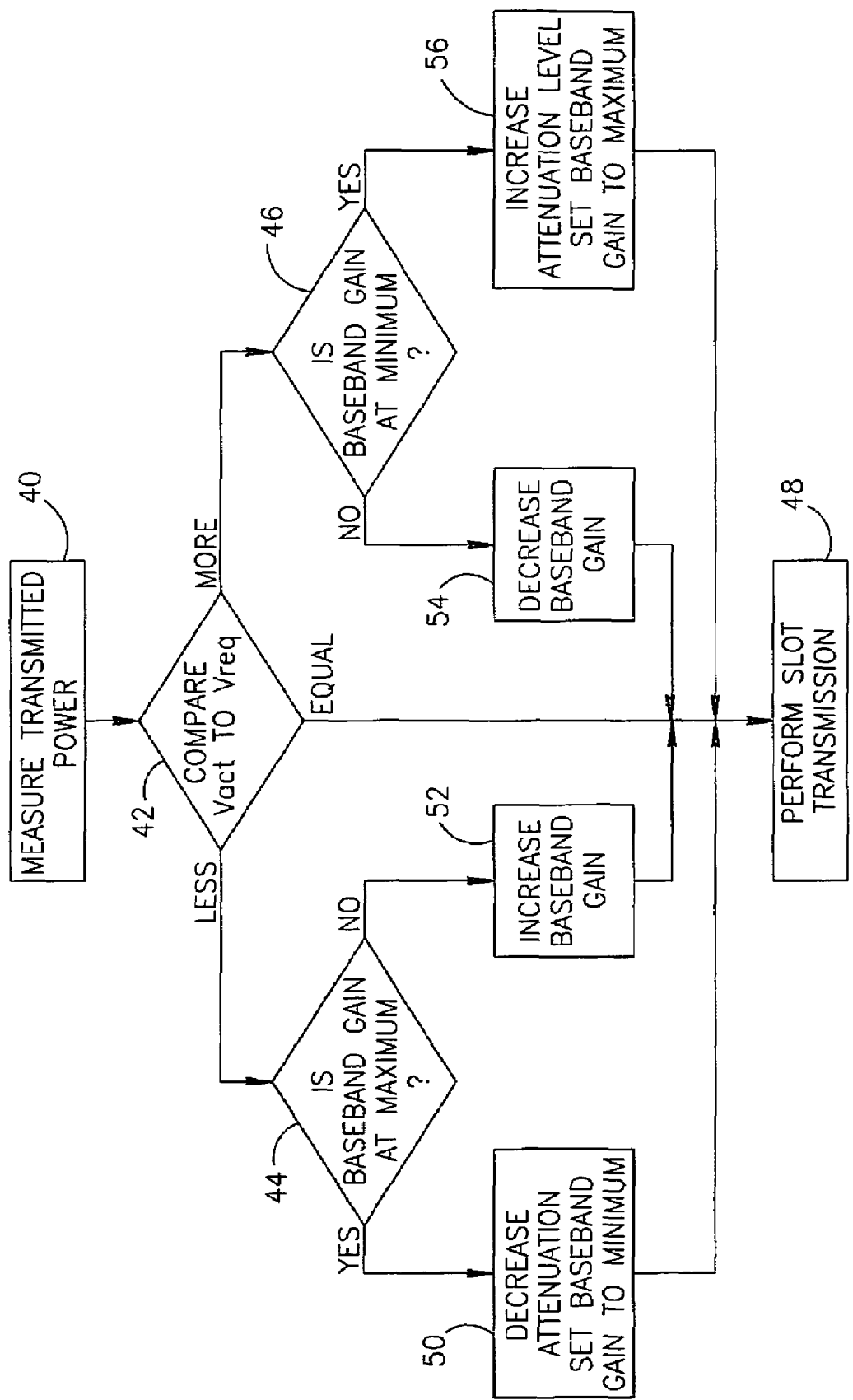
FIG. 2 is a flow chart illustration of the operation of an automatic level control unit forming part of the transmitter of FIG. 1.

Reference is also made to FIG. 2, which generally illustrates the operation of ALC 34. Initially (step 40), power detector 30 measures the transmitted power $V_{act}$ by integrating the received power over a full slot. The transmitted power $V_{act}$ is then compared to the desired power level $V_{req}$ (step 42) and different operations are performed if it is less (to step 44), more (to step 46) or equal (to step 48).

If the measured transmitted power $V_{act}$ is at the desired level $V_{req}$, then no corrections are necessary and the signal can be transmitted as is (step 48).

If the measured transmitted power $V_{act}$ is less than the desired level $V_{req}$, then the power level may be raised. In most cases, fine control may be utilized (i.e. the baseband gain is raised (step 52) by a set amount). However, when the baseband gain is already at its maximum (checked in step 44), the power level may be changed by a coarse amount. Thus, the attenuation may be decreased (step 50) by a set amount, such as 2 dB, and the baseband gain may be set to its minimum level.

If the transmitted power $V_{act}$ is more than the desired level $V_{req}$, then the power level may be reduced, as a function of whether or not the baseband gain is already at a minimum (checked in step 46). If it is at the minimum, ALC 34 may perform coarse control and the attenuation may be increased (step 56) by a set amount, such as 2 dB, and the baseband gain may be set to the maximum. If the baseband level is not at the minimum, then, ALC 34 may perform fine control and in step 54, the baseband gain may be decreased Once the attenuation and/or baseband gain have been altered, slot transmission may be performed (step 48).

Figure 3:
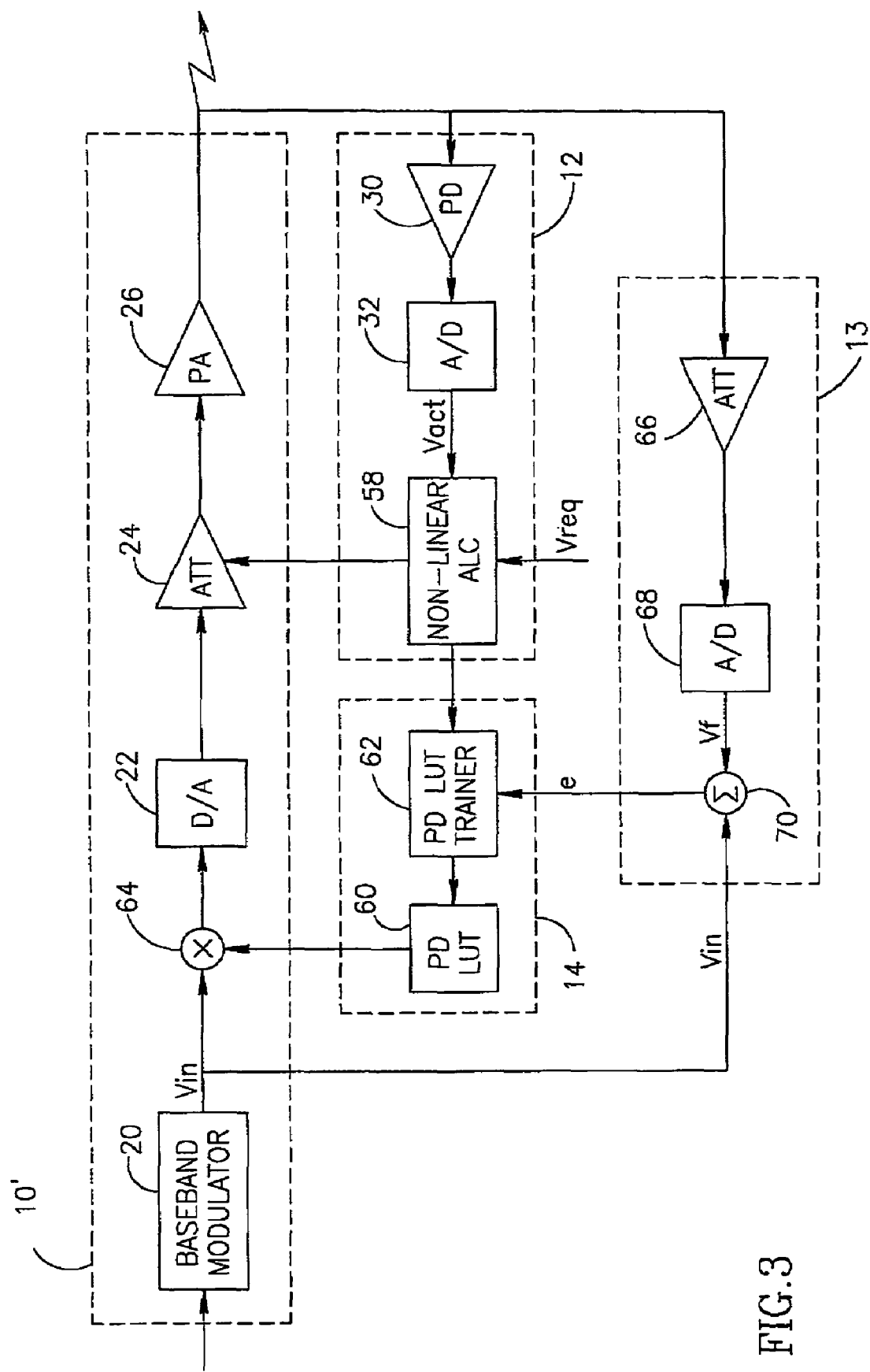
FIG. 3 is a block diagram illustration of an alternative embodiment of the present invention.

Reference is now made to FIG. 3, which illustrates an alternative embodiment of the present invention generally operative for non-linear power amplifiers. Similar reference numerals are used to refer to similar elements of FIG. 1.

FIG. 3 shows a transmission path 10', power feedback path 12, a signal feedback path 13 and a predistorter 14. The transmission path 10' generally comprises some or all of the following elements: baseband modulator 20, a digital to analog (D/A) converter 22, an attenuator 24 and a power amplifier 26.

Predistorter 14 comprises a predistorter (PD) lookup table (LUT) 60 and a PD LUT trainer 62. PD LUT 60 may predistort the signal from baseband modulator 20 in order to compensate for the distortion produced by power amplifier 26. To do so, the output of PD LUT 60 may be multiplied with the output of baseband modulator 20 by multipliers 64 in transmission path 10'.

PD LUT trainer 62 may regularly update the values of PD LUT 60 based on data received along both feedback paths 12 and 13. PD LUT trainer 62 is also operative to update the values of PD LUT 60 when given a desired linear gain value K of transmission path 10'. The linear gain K may be defined as $K=V_{act}/V_{in}$, where $V_{act}$ is the digital voltage signal produced by power detector 30 and $V_{in}$ is the output signal of baseband modulator 20.

Power feedback path 12 comprises generally the same elements as that in the previous embodiment except that, in this embodiment, it comprises a non-linear ALC 58 that receives the $V_{req}$ signal and controls both attenuator 24 and PD LUT trainer 62, as described in more detail hereinbelow.

Signal feedback path 13 comprises some or all of the following elements: an attenuator 66, an A/D converter 68 and a summer 70. Attenuator 66 may receive the transmitted radio frequency signal and A/D converter 68 may convert the signal into a digital voltage signal $V_f$ indicative of the transmitted signal. Summer 70 may subtract the received signal $V_f$ from the baseband signal $V_{in}$ produced by baseband modulator 20, thereby to produce an error signal e which is used to adapt the PD LUT values using an adaptive algorithm as, for example, disclosed in "The Effect of Quadrature Modulator and Demodulator Errors on Adaptive Digital Predistortion for Amplifier Linearization" by J. K. Cavers, *IEEE Transactions on Vehicular Technology*, Vol. 40, No. 2, May 1997. PD LUT trainer 62 may receive error signal e, and may adapt PD LUT 60 as necessary to control the gain of transmission path 10.

Non-linear ALC 58 attempts to ensure that the transmitted output power does not go out of range. For this purpose, non-linear ALC 58 has two modes of operation. Initially, it may compare the transmitted power, as measured by $V_{act}$, to the desired level $V_{req}$, to determine a new transmission gain $K_{new}$. For example, $$K_{new} = K_{old} \frac{V_{req}}{V_{act}}.$$

Typically, ALC 34 may instruct PD LUT trainer 62 to change PD LUT 60 to ensure that following transmission slots have the new transmission gain $K_{new}$.

Figure 4:
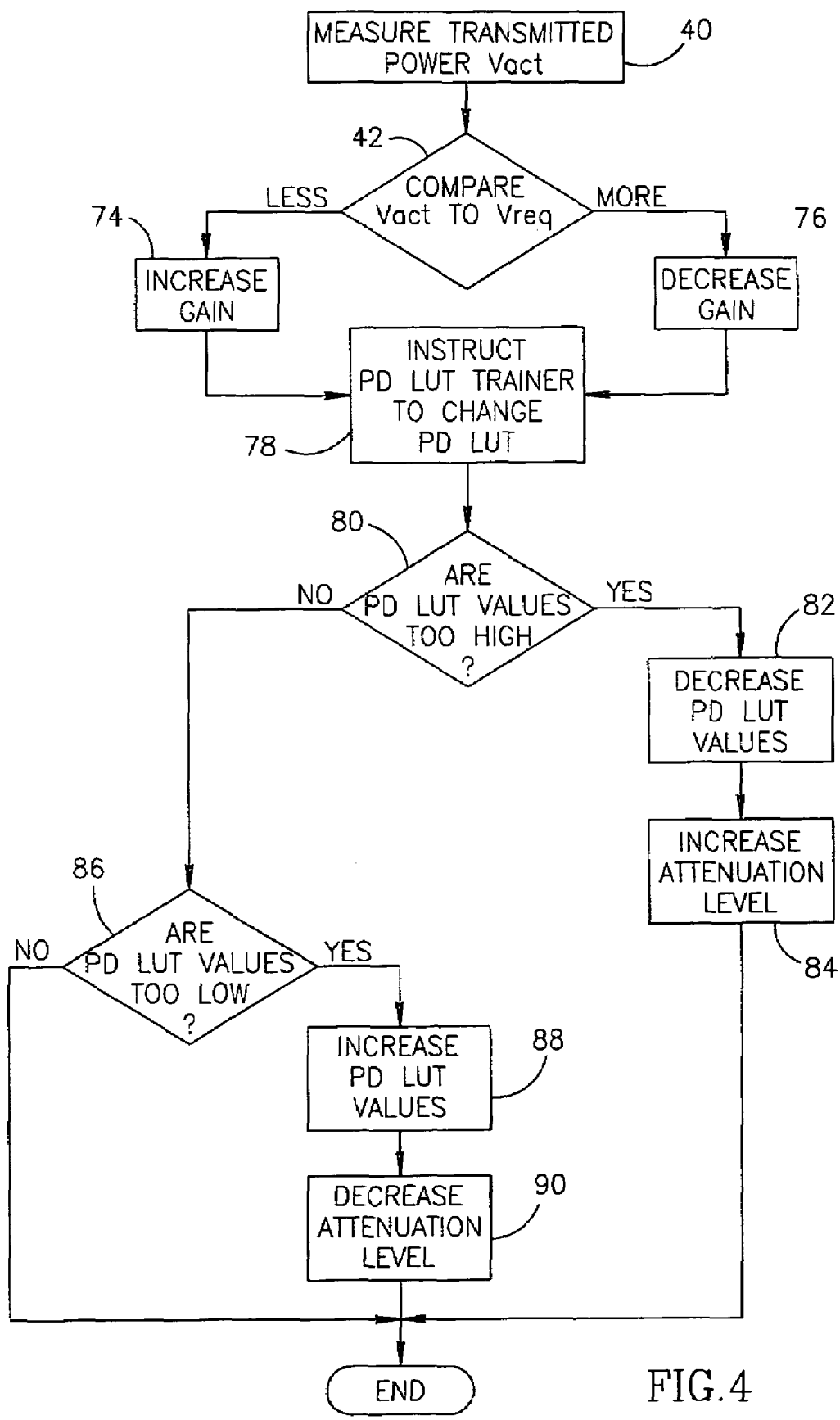
FIG. 4 is a flow chart illustration of the operation of an automatic level control unit forming part of the transmitter of FIG. 3.

During regular operation, non-linear ALC 58 may operate in a tracking mode, illustrated in FIG. 4 to which reference is now made, to ensure that the output transmission power is generally constant. For each slot, ALC 58 may measure transmitted power $V_{act}$ (step 70) and may compare it (step 72) to desired level $V_{req}$. If the measured transmitted power $V_{act}$ is higher by more than 0.1 dB, then ALC 58 may decrease transmission gain K (step 76), typically by 0.1 dB. Otherwise, ALC 58 may increase the gain (step 74), typically by 0.1 dB.

In addition, ALC 58 may check the levels of the values in PD LUT 60 to ensure that none of them become numerically too large or too small. Both cases can cause "clipping" of the PD LUT data, which is undesirable.

In step 80, ALC 58 may check that the PD LUT values are not too high, as defined by a maximum allowable value. If they are, ALC 58 may decrease (step 82) the PD LUT values and increase (step 84) the attenuation level of attenuator 24 to compensate and to maintain generally the same gain level K of transmission path 10'. The size of the increase/decrease generally is matched and it is typically defined by the size of the attenuation step. This is typically 2 dB.

If the PD LUT values are not too high, they might be too low, as defined by a minimum allowable value. This is checked in step 86. If they are too low, then ALC 58 may decrease (step 90) the attenuation level of attenuator 24 by a known amount and increase (step 88) the values written in the PD LUT by the same known amount, such that the linear gain $K_{new}$ of transmission path 10' does not change.

The PD LUT values are not changed if they are between the maximum and minimum values.

The methods and apparatus disclosed herein have been described without reference to specific hardware or software. Rather, the methods and apparatus have been described in a manner sufficient to enable persons of ordinary skill in the art to readily adapt commercially available hardware and software as may be needed to reduce any of the embodiments of the present invention to practice without undue experimentation and using conventional techniques.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the spirit of the invention.

What is claimed is:

1. A method comprising: measuring transmitted power; and adjusting a power level of said a transmission path using fine and coarse controls by:
    lowering a baseband gain of a baseband modulator in said transmission path if said measured transmitted power is more than a predetermined power level;
    raising said baseband gain if said measured transmitted power is less than said predetermined power level;
    raising an attenuation level of an attenuator in said transmission path and setting said baseband gain to a maximum if said baseband gain is at a minimum and said measured transmitted power is more than said predetermined power level; and
    lowering said attenuation level and setting said baseband gain to a minimum if said baseband gain is at a maximum and said measured transmitted power is less than said predetermined power level.

2. A method according to claim 1 and wherein said fine control is control of the baseband gain of said baseband modulator in said transmission path.

3. A method according to claim 1 and wherein said coarse control is control of the attenuation level of said attenuator in said transmission path.

4. A method according to claim 1 and wherein said transmission path includes a linear power amplifier.

5. A transmitter comprising:
    a power detector to measure transmitted power; a transmission path including a baseband modulator and an attenuator;
    an adjuster to adjust a power level of said transmission path using fine and coarse controls by:
    lowering a baseband gain of said baseband modulator in said transmission path if said measured transmitted power is more than a predetermined power level;
    raising said baseband gain if said measured transmitted power is less than said predetermined power level;
    raising an attenuation level of said attenuator in said transmission path and setting said baseband gain to a maximum if said baseband gain is at a minimum and said measured transmitted power is more than said predetermined power level; and
    lowering said attenuation level and setting said baseband gain to a minimum if said baseband gain is at a maximum and said measured transmitted power is less than said predetermined power level.

6. A transmitter according to claim 5, wherein said fine control is control of the baseband gain of said baseband modulator.

7. A transmitter according to claim 5, wherein said coarse control is control of the attenuation level of said attenuator.

8. A transmitter according to claim 5 and wherein said transmission path comprises a linear power amplifier.

9. A transmitter according to claim 5 formed within a mobile unit of a communication system.

10. A transmitter according to claim 5 formed within a base station of a communication system.

* * * * *